(12) United States Patent
Wang

(10) Patent No.: US 8,743,551 B2
(45) Date of Patent: Jun. 3, 2014

(54) SERVER RACK SYSTEM

(75) Inventor: Shi-Feng Wang, Shanghai (CN)

(73) Assignee: Inventec Corporation, Taipei (TW)

( * ) Notice: Subject to any disclaimer, the term of this patent is extended or adjusted under 35 U.S.C. 154(b) by 302 days.

(21) Appl. No.: 13/372,216

(22) Filed: Feb. 13, 2012

(65) Prior Publication Data

US 2013/0135805 A1    May 30, 2013

(30) Foreign Application Priority Data

Nov. 28, 2011   (CN) .......................... 2011 1 0383839

(51) Int. Cl.
*H05K 7/00* (2006.01)

(52) U.S. Cl.
USPC .......................................... 361/727; 361/748

(58) Field of Classification Search
USPC .......................................................... 361/727
See application file for complete search history.

(56) References Cited

U.S. PATENT DOCUMENTS

| | | | | |
|---|---|---|---|---|
| 4,179,724 A * | 12/1979 | Bonhomme | .................. | 361/727 |
| 4,853,830 A * | 8/1989 | Corfits et al. | .................. | 361/725 |
| 5,159,534 A * | 10/1992 | Hudson et al. | .................. | 361/730 |
| 5,385,481 A * | 1/1995 | Kotyuk | .................. | 439/378 |
| 5,411,416 A * | 5/1995 | Balon et al. | .................. | 439/639 |
| 5,706,179 A * | 1/1998 | Palatov | .................. | 361/788 |
| 5,808,876 A * | 9/1998 | Mullenbach et al. | .......... | 361/788 |
| 5,822,551 A * | 10/1998 | Crane et al. | .................. | 710/307 |
| 5,872,701 A * | 2/1999 | Hayden et al. | .................. | 361/786 |
| 6,385,053 B1 * | 5/2002 | Parizi et al. | .................. | 361/786 |
| 6,594,150 B2 * | 7/2003 | Creason et al. | .................. | 361/727 |
| 6,621,712 B2 * | 9/2003 | Siira et al. | .................. | 361/796 |
| 6,625,019 B1 * | 9/2003 | Steinman et al. | .................. | 361/695 |
| 6,628,525 B2 * | 9/2003 | Miller et al. | .................. | 361/756 |
| 6,833,996 B2 * | 12/2004 | Haworth | .................. | 361/730 |
| 6,870,743 B2 * | 3/2005 | Mease et al. | .................. | 361/796 |
| 6,927,974 B2 * | 8/2005 | Robillard et al. | .......... | 361/679.4 |
| 6,927,983 B1 * | 8/2005 | Beseth et al. | .................. | 361/796 |
| 7,102,887 B2 * | 9/2006 | Blackwell | .................. | 361/695 |
| 7,239,523 B1 * | 7/2007 | Collins et al. | .................. | 361/752 |
| 7,529,097 B2 * | 5/2009 | Coglitore et al. | .......... | 361/725 |
| 7,551,456 B2 * | 6/2009 | Behrens et al. | .................. | 361/788 |
| 7,690,927 B1 * | 4/2010 | Kerrigan et al. | .......... | 439/74 |
| 7,715,207 B2 * | 5/2010 | Behrens et al. | .................. | 361/788 |
| 7,924,570 B2 * | 4/2011 | Randall et al. | .................. | 361/724 |
| 8,385,077 B2 * | 2/2013 | Yamada | .................. | 361/741 |

(Continued)

FOREIGN PATENT DOCUMENTS

| | | |
|---|---|---|
| CN | 101030910 A | 9/2007 |
| CN | 101416459 A | 4/2009 |
| WO | 2008113054 A2 | 9/2008 |

*Primary Examiner* — Anthony Q Edwards
(74) *Attorney, Agent, or Firm* — CKC & Partners Co., Ltd.

(57) ABSTRACT

A server rack system includes a rack and a network board card. The rack includes rack layer type spaces arranged along a vertical axis direction. The rack layer type spaces are used for receiving a network switch unit and a server unit slidably inserted along a horizontal axis direction. The network board card is disposed along the vertical axis direction and between the top and the bottom of the rack. The network board card includes network interfaces. The network interfaces are arranged along the vertical axis direction on the network board card. The network interfaces include a first type network interface used for being connected to the network switch unit and a second type network interface used for being connected to the server unit. The first type network interface is connected to the second type network interface by an integrated circuit deployed in the network board card.

16 Claims, 8 Drawing Sheets

(56) References Cited

U.S. PATENT DOCUMENTS

| | | | |
|---|---|---|---|
| 8,411,440 B2* | 4/2013 | Dunwoody et al. | 361/699 |
| 8,435,047 B2* | 5/2013 | Patel et al. | 439/76.1 |
| 8,582,302 B2* | 11/2013 | Peterson et al. | 361/724 |
| 8,649,180 B2* | 2/2014 | Grady et al. | 361/725 |
| 2005/0112940 A1* | 5/2005 | Naganishi | 439/540.1 |
| 2006/0044766 A1* | 3/2006 | Hartel et al. | 361/724 |
| 2013/0063894 A1* | 3/2013 | Wang | 361/692 |
| 2013/0067248 A1* | 3/2013 | Wang | 713/300 |

\* cited by examiner

SERVER RACK SYSTEM

CROSS-REFERENCE TO RELATED APPLICATION

This application claims the priority benefit of China application serial no. 201110383839.4, filed on Nov. 28, 2011. The entirety of the above-mentioned patent application is hereby incorporated by reference herein and made a part of this specification.

BACKGROUND OF THE INVENTION

1. Field of the Invention

The present invention generally relates a server rack system, in particular, to a server rack system having a network board card.

2. Description of Related Art

A server is a core computer serving computers in a network system, may provide network users with desired functions, such as magnetic disk and printing services, and meanwhile may enable user ends to share resources in the network environment mutually. A basic architecture of a server is substantially the same as that of a normal personal computer, and is formed by components, such as a central processing unit (CPU), a memory and input/output (I/O) apparatuses, which are connected internally by a bus. The CPU is connected to the memory by a northbridge chip, and the I/O apparatus are connected by a southbridge chip. With respect to the structure of the chassis, the server undergoes three evolution stages, namely, from the early tower chassis to the rack type emphasizing integrated performance, and then to the blade server of high-density computing.

Here a rack server is taken as an example. The rack server is a server has an appearance designed according to uniform standards, and is used in combination with a cabinet. It can be said that the rack type is a tower server with an optimized structure, the main design objective of which is to reduce the space occupied by the server as much as possible. Many professional network apparatuses, for example, switches, routers and hardware firewalls, employ the rack structure, and are mostly of a flat type, as drawers. The rack server has the width of 19 inches and the height in the unit of U (1 U=1.75 inches=44.45 millimeters). Generally, standard servers of 1 U, 2 U, 3 U, 4 U, 5 U and 7 U are available.

Generally speaking, server units and network switch units (for example, the switches, routers and hardware firewalls) in a rack are usually connected between server units and a power supply module by cables respectively, so that the power supply module provides power needed by the server units and the network switch units in a unified manner However, in this way spaces for placing the cables and spaces reserved for the cables to move along with the chassis when the server units and the network switch units are drawn are inevitably required to be additionally provided in the rack, which is likely to make configuration and utilization efficiency of the space in the rack be poor. Further, as the number of the server units increases, the number of the cables increases, which is likely to turn the cables into a mess hindering operation of a user.

SUMMARY OF THE INVENTION

The present invention is directed to a server rack system, which can decrease the number of cables in a rack.

The present invention provides a server rack system, which includes a rack and at least one network board card. The rack includes a plurality of rack layer type spaces arranged along a vertical axis direction. The rack layer type spaces are used for receiving at least one network switch unit and at least one server unit slidably inserted along a horizontal axis direction. The network board card is disposed along the vertical axis direction and between the top and the bottom of the rack. The network board card includes a plurality of network interfaces. The network interfaces are arranged along the vertical axis direction on the network board card. The network interfaces at least include a first type network interface used for being connected to the network switch unit and a second type network interface used for being connected to the server unit. The first type network interface is connected to the second type network interface by an integrated circuit deployed in the network board card.

In an embodiment of the present invention, the network interfaces protrude in a direction in which the network switch unit and the server unit are inserted into the rack; after the network switch unit and the server unit are inserted into the rack, the first type network interface is connected by insertion to a network interface of the network switch unit, and the second type network interface is connected by insertion to a network interface of the server unit.

In an embodiment of the present invention, the first type network interface is disposed in the middle of the network board card.

In an embodiment of the present invention, positions in which the network interfaces are disposed correspond to the rack layer type spaces of the rack in a one-on-one manner.

In an embodiment of the present invention, the server rack system further includes a base, disposed along the vertical axis direction and between the top and the bottom of the rack, where the network board card is superimposed on a surface of the base along the vertical axis direction.

In an embodiment of the present invention, the server rack system further includes a power supply unit and at least one power supplying module. The power supply unit is slidably inserted in a rack layer type space along the horizontal axis direction. The power supplying module is disposed along the vertical axis direction and between the base and the network board card, and for transferring power between the power supply unit and the server unit. The power supplying module includes a first conductive plate, an insulation layer, a second conductive plate, a first power supply terminal, a second power supply terminal and a plurality of output pin pairs. The first conductive plate, the insulation layer and the second conductive plate are superimposed on the base in sequence, and the insulation layer is configured between the first conductive plate and the second conductive plate. The first power supply terminal is inserted into the first conductive plate, and the second power supply terminal is inserted into the second conductive plate. The first power supply terminal and the second power supply terminal are used for connecting the power supply unit in the rack to obtain power supplied. Each output pin pair includes a first output pin inserted into the first conductive plate and a second output pin inserted into the second conductive plate. The plurality of output pin pairs is used for being connected to the server units in the rack, so as to transfer power to the server units. The network board card includes a plurality of open holes, positions of the open holes correspond to the first output pins and the second output pins of the output pin pairs, and the first output pins and the second output pins of the output pin pairs protrude through the open holes in the direction in which the server unit is inserted into the rack.

In an embodiment of the present invention, the first output pin of an output pin pair passes through the insulation layer and the second conductive plate to protrude to the outside of the second conductive plate in the same direction as the second output pin of the output pin pair.

In an embodiment of the present invention, a ring-shaped insulator surrounding the first output pin is disposed in the second conductive plate, and the ring-shaped insulator is used for preventing the first output pin from electrically contacting the second conductive plate.

In an embodiment of the present invention, the server unit has a set of positioning holes, a set of electrodes and a network interface at an end inserted into the rack.

In an embodiment of the present invention, a plurality of positioning pins is configured on the base along the vertical axis direction, a position of a set of positioning pins correspondingly matches at least one network interface of the network board card and an output pin pair of the power supplying module, and an output pin pair of the power supplying module corresponds to a position where a network interface of the network board card is disposed in a one-on-one manner. When a set of positioning pins is correspondingly connected by insertion to a set of positioning holes on the server unit, the first output pin and the second output pin of the output pin pair corresponding to the set of positioning pins are electrically connected to a pair of electrodes of the server unit respectively, and the network interface corresponding to the set of positioning pins is connected by insertion to the network interface of the server unit.

In an embodiment of the present invention, the sets of positioning pins, the output pin pairs and the network interfaces protrude along a horizontal axis of the rack in the same direction, and top ends of the sets of positioning pins are higher than top ends of the output pin pairs and top ends of the network interfaces.

In an embodiment of the present invention, a position in the rack where a set of positioning pins and a corresponding output pin pair thereof are disposed matches a rack layer type space of the rack.

In an embodiment of the present invention, the number of the at least one network board card is two, and the two network board cards are superimposed on an upper half part and a lower half part of the base respectively. The two network board cards are disposed independent of each other, and are both superimposed along the vertical axis and on the same surface of the base. The number of the at least one power supplying module is two, the two power supplying modules are superimposed on the upper half part and the lower half part of the base respectively. The two power supplying modules are disposed independent of each other, and are both superimposed along the vertical axis and on the same surface of the base.

In an embodiment of the present invention, the server rack system further includes a fan wall, which is disposed on a rear wall of the rack and formed by a plurality of fan units. The base, the network board card and the power supplying module are disposed between the fan wall and the rack layer type spaces.

In an embodiment of the present invention, the fan units each have a fan controller, and the fan controller is connected to the network switch unit by a network interface on the network board card, and is connected to the power supply unit by an output pin pair on the power supplying module.

In an embodiment of the present invention, the server rack system further includes an integrated management unit, which is slidably inserted in a rack layer type space along the horizontal axis direction. The integrated management unit is connected to a network interface on the network board card, and is used to manage the server unit in the rack through the network switch unit.

Based on the above, in the embodiments of the present invention, the network board card is configured in the rack, and the network board card includes the plurality of network interfaces, so that after being assembled in the rack, the server unit and the network switch unit can be connected to the corresponding network interfaces automatically, and therefore the server unit and the network switch unit perform data transmission through the network board card. In this way, the situations that the poor space utilization rate may be caused by electrical connection performed by using cables and operation of a user is hindered by messed cable configuration can be avoided effectively, and a neat transmission structure acts as a replacement, thereby achieving an effect of electrical connection required by the server unit and the network switch unit.

To make the features and advantages of the present invention more comprehensible, embodiments are provided below and are described in detail in the following with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
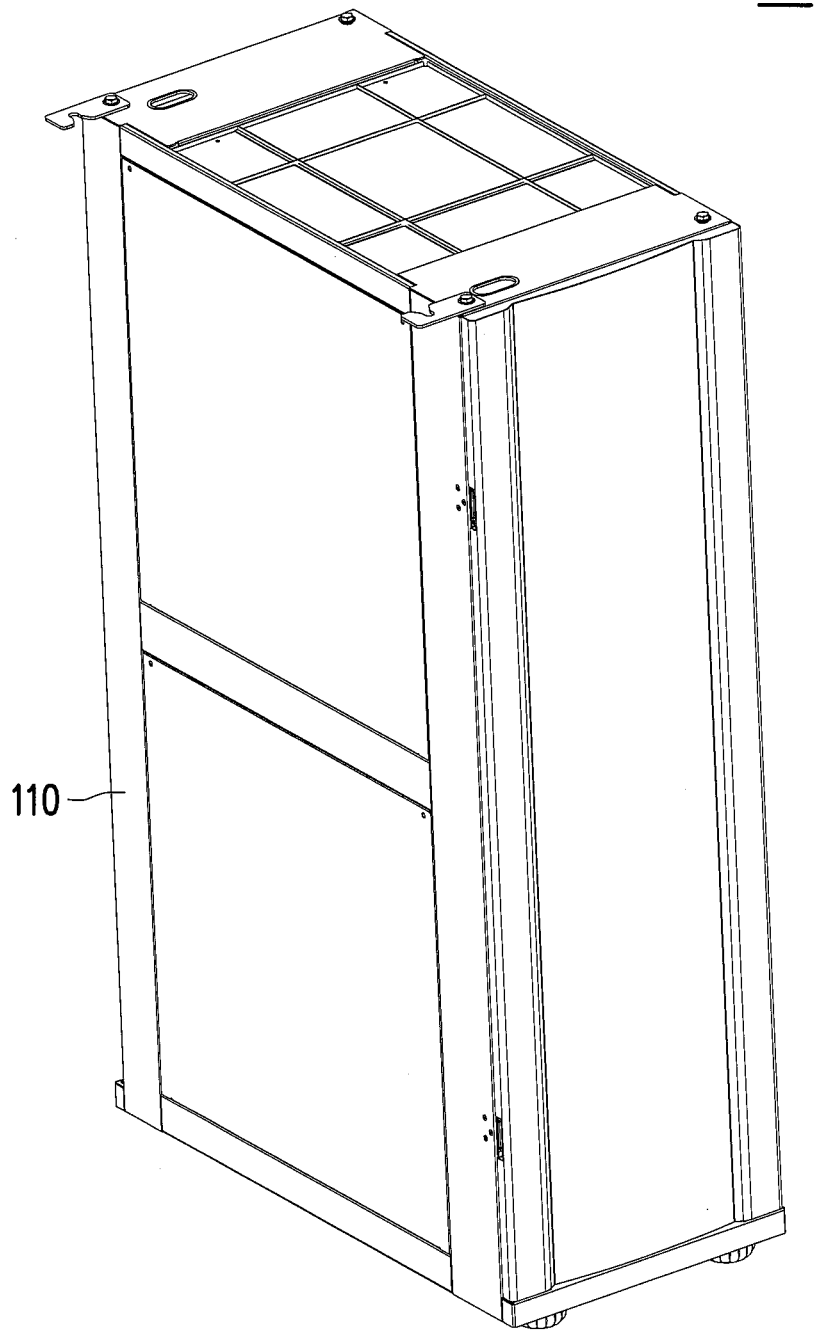
FIG. 1 is a schematic view of a server rack system according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
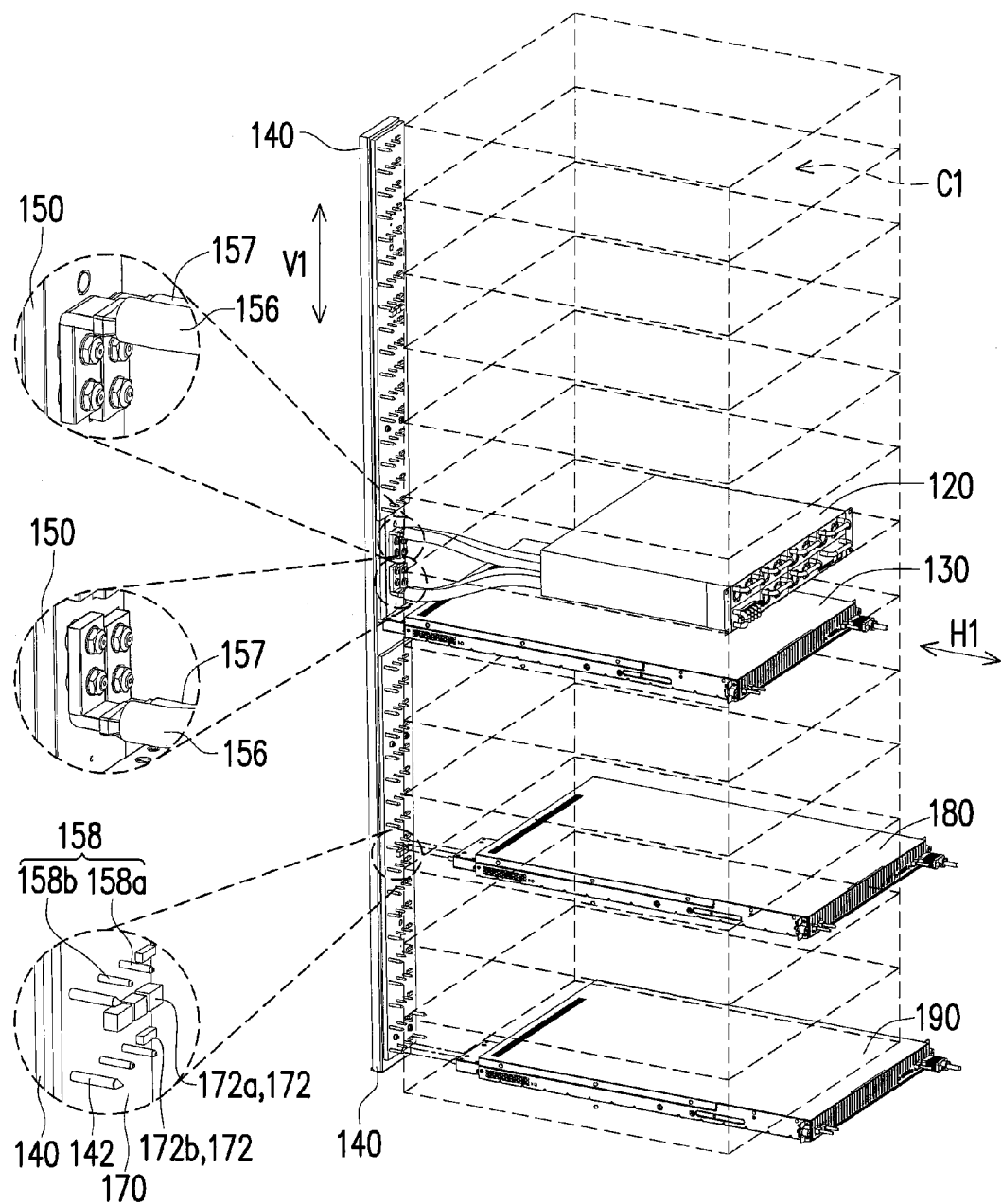
FIG. 2 is a schematic view of partial members in the server rack system of FIG. 1.
Figure 3:
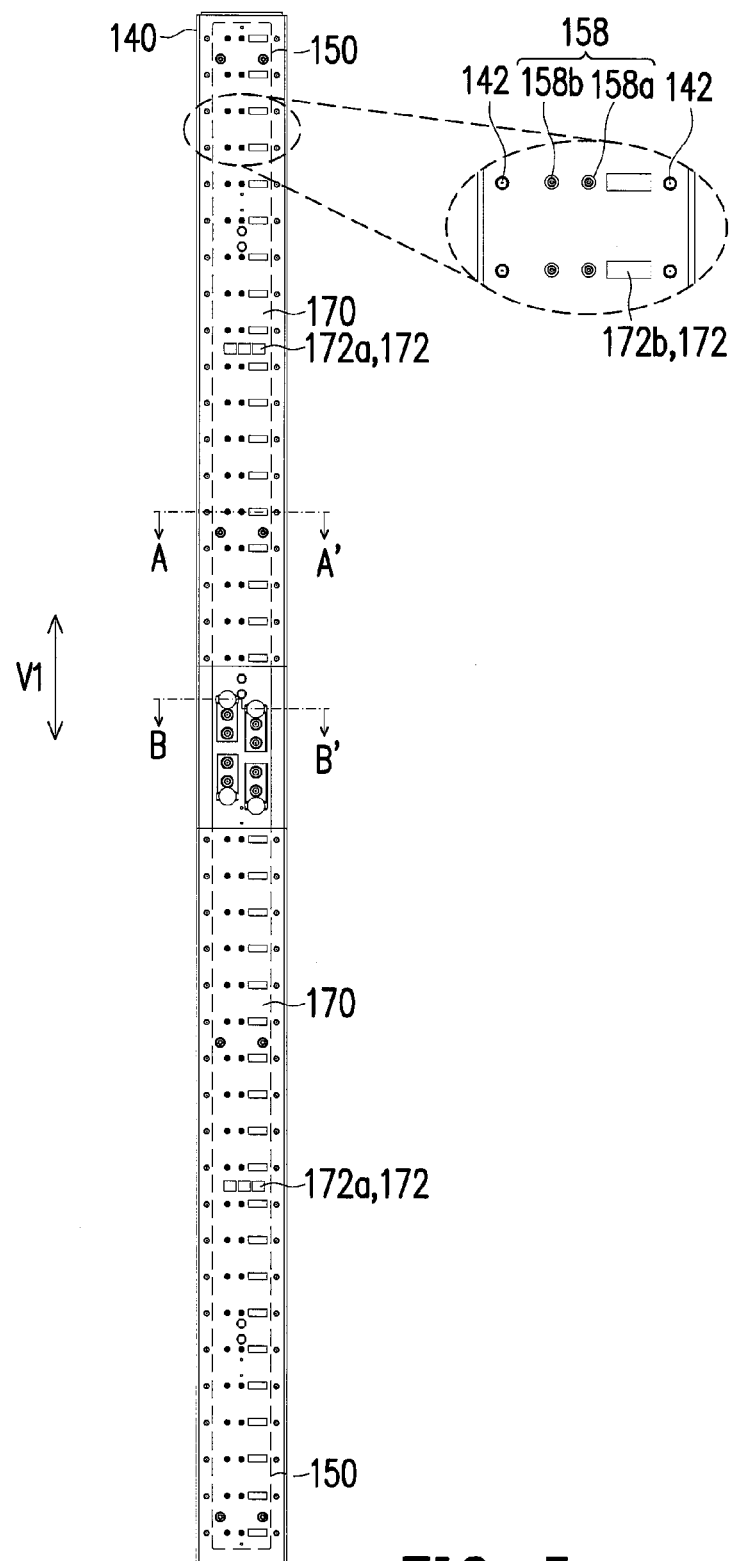
FIG. 3 is a schematic view of a network board card and a base of FIG. 2.

FIG. 1 is a schematic view of a server rack system according to an embodiment of the present invention. FIG. 2 is a schematic view of partial members in the server rack system of FIG. 1. FIG. 3 is a schematic view of a network board card and a base of FIG. 2. FIG. 2 shows only partial members in the internal space of a rack, so as to illustrate a relative relationship between members clearly. Referring to FIG. 1 to FIG. 3, in the embodiment, a server rack system 100 includes a rack 110, a base 140 and at least one network board card 170. The rack 110 has a plurality of rack layer type spaces C1. The rack layer type spaces C1 are used to receive at least one network switch unit 180 and at least one server unit 130 slidably inserted along a horizontal axis direction H1. The base 140 is disposed between the top and bottom of the rack 110 along a vertical axis direction V1. The network board cards 170 are superimposed on a surface of the base 140 along the vertical axis direction V1. Herein, only one server unit 130 and one network switch unit 180 are illustrated, but the embodiment is not limited thereto.

Figure 4:
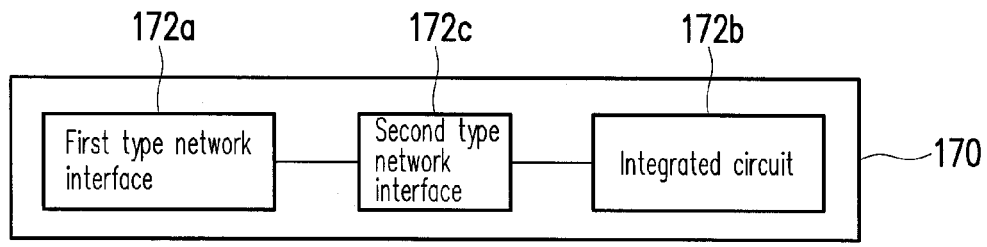
FIG. 4 is a block diagram of partial members of the network board card of FIG. 2.

The network board card 170 is disposed between the top and the bottom of the rack 110 along the vertical axis direction V1. The network board card 170 includes a plurality of network interfaces 172. The network interfaces 172 are arranged along the vertical axis direction V1 on the network board card 170. The network interfaces 172 at least include a first type network interface 172a and a second type network interface 172b. The first type network interface 172a is used for being connected to the network switch unit 180. The second type network interface 172b is used for being connected to the server unit 130. FIG. 4 is a block diagram of partial members of the network board card of FIG. 2. Referring to FIG. 4, the first type network interface 172a is connected to the second type network interface 172b by an integrated circuit 172c deployed in the network board card 170.

Under the configuration, the network board card 170 is configured in the rack 110, and the network board card 170 includes the plurality of network interfaces 172, so that after being assembled in the rack 110, the server unit 130 and the network switch unit 180 can be connected to the corresponding network interfaces 172 automatically, and therefore the server unit 130 and the network switch unit 180 perform data transmission through the network board card 170. In this way, the situations that a poor space utilization rate may be caused by electrical connection performed by using cables and operation of a user is hindered by messed cable configuration can be avoided effectively, and a neat transmission structure acts as a replacement, thereby achieving an effect of electrical connection required by the server unit 130 and the network switch unit 180.

Figure 5:
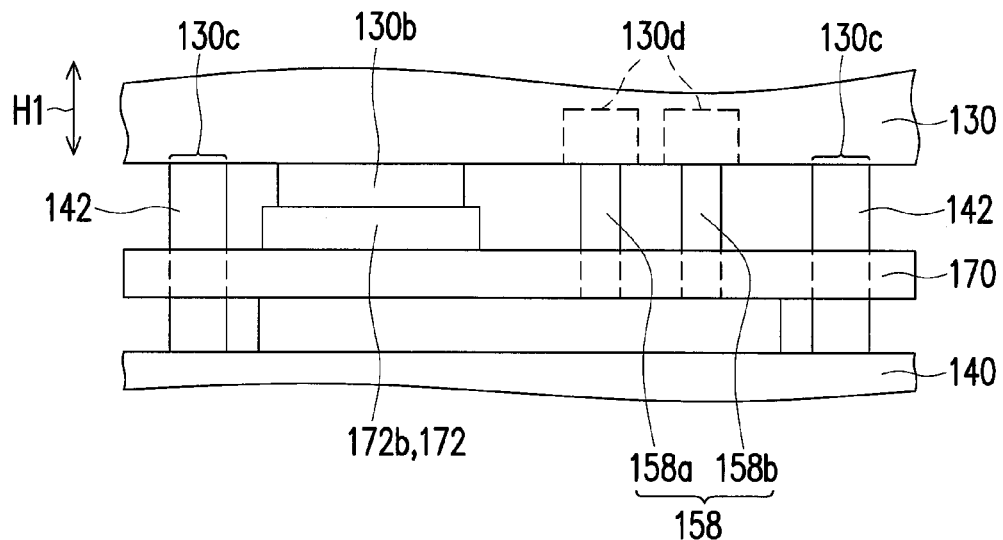
FIG. 5 is a schematic top view of a server unit of FIG. 2 connected to a network board card.
Figure 6:
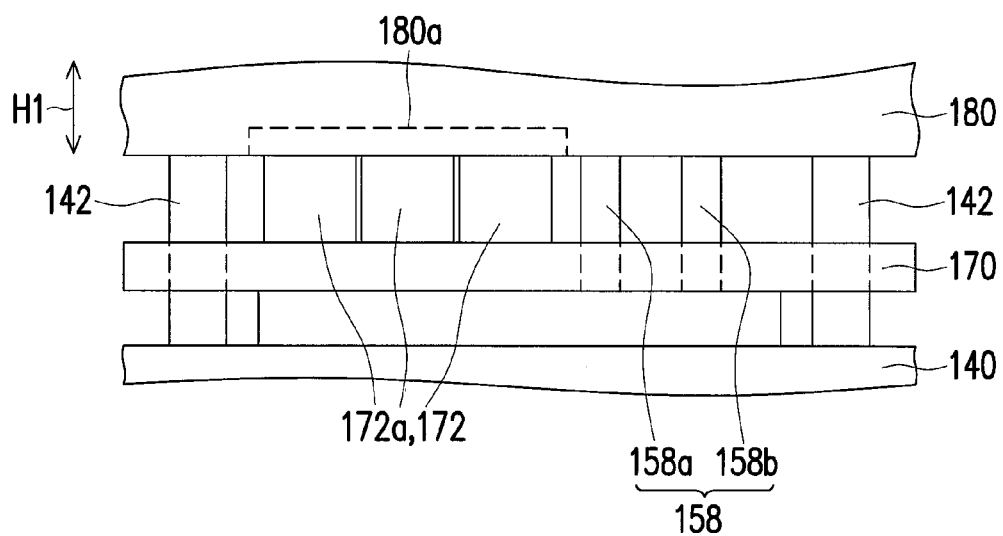
FIG. 6 is a schematic top view of a network switch unit of FIG. 2 connected to a network board card.

FIG. 5 is a schematic top view of a server unit of FIG. 2 connected to the network board card. FIG. 6 is a schematic top view of a network switch unit of FIG. 2 connected to the network board card. Referring to FIG. 5 and FIG. 6, the network interfaces 172 protrude in a direction in which the network switch unit 180 and the server unit 130 are inserted into the rack 110 (shown in FIG. 1). After the network switch unit 180 and the server unit 130 are inserted into the rack 110, the first type network interface 172a is connected by insertion to a network interface 180a of the network switch unit 180, and the second type network interface 172b is connected by insertion to a network interface 130b of the server unit 130.

As shown in FIG. 2 and FIG. 3, positions where the network interfaces 172 are disposed correspond to the rack layer type spaces C1 of the rack 110 in a one-on-one manner. Further, the number of the network board cards 170 in the embodiment is two. The two network board cards 170 are superimposed on an upper half part and a lower half part of the base 140 respectively. The two network board cards 170 are disposed independent of each other, and are both superimposed along the vertical axis and on the same surface of the base 140. Each first type network interface 172a is disposed in the middle of the corresponding network board card 170.

Figure 7:
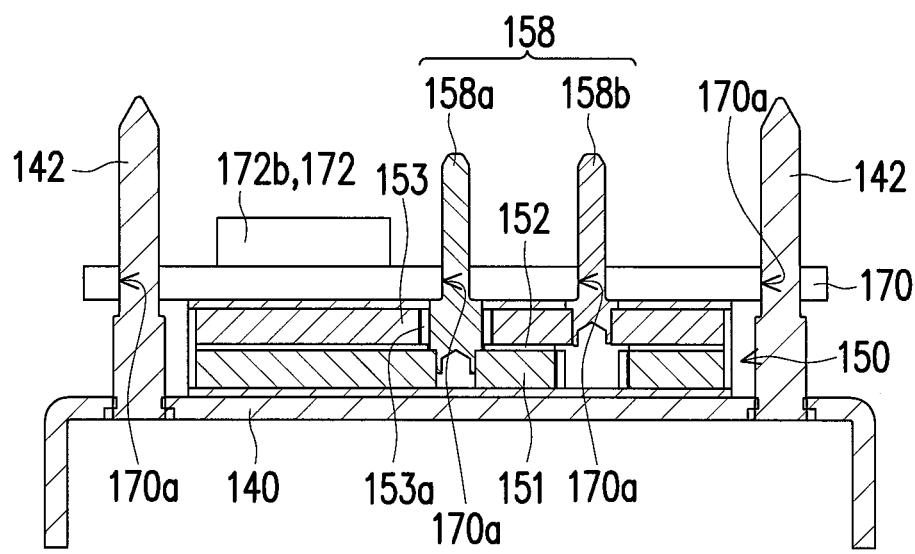
FIG. 7 is a sectional view along A-A' of FIG. 3.

FIG. 7 is a sectional view along A-A' of FIG. 3. Referring to FIG. 2, FIG. 3 and FIG. 7, specifically, the server rack system 100 of the embodiment further includes a power supply unit 120 and a power supplying module 150. The power supply unit 120 is slidably inserted in a rack layer type space C1 along the horizontal axis direction H1. Only one power supply unit 120 is illustrated herein, but the embodiment is not limited thereto. The power supplying module 150 is inserted between the base 140 and the network board card 170 along the vertical axis direction V1, and is used to transfer power between the power supply unit 120 and the server unit 130. After the server unit 130 (or another electronic apparatus) is inserted in the rack layer type space C1 along the horizontal axis H1, the power supplying module 150 creates a relationship of electrical connection between the server unit 130 (or the another electronic apparatus) and the power supply unit 120, so as to transfer power generated by the power supply unit 120 to the server unit 130 through the power supplying module 150, thereby enabling the server unit 130 to obtain the power enabling the server unit 130 to operate. Therefore, cables connected between the power supply unit 120 and the server units 130 are saved, thereby enabling the rack 110 to have a neat layout inside, increasing the space utilization rate in the rack 110, and avoiding the situation that normal operation performed by the user on the server rack system 100 is affected by too many cables in the rack 110.

Figure 8:
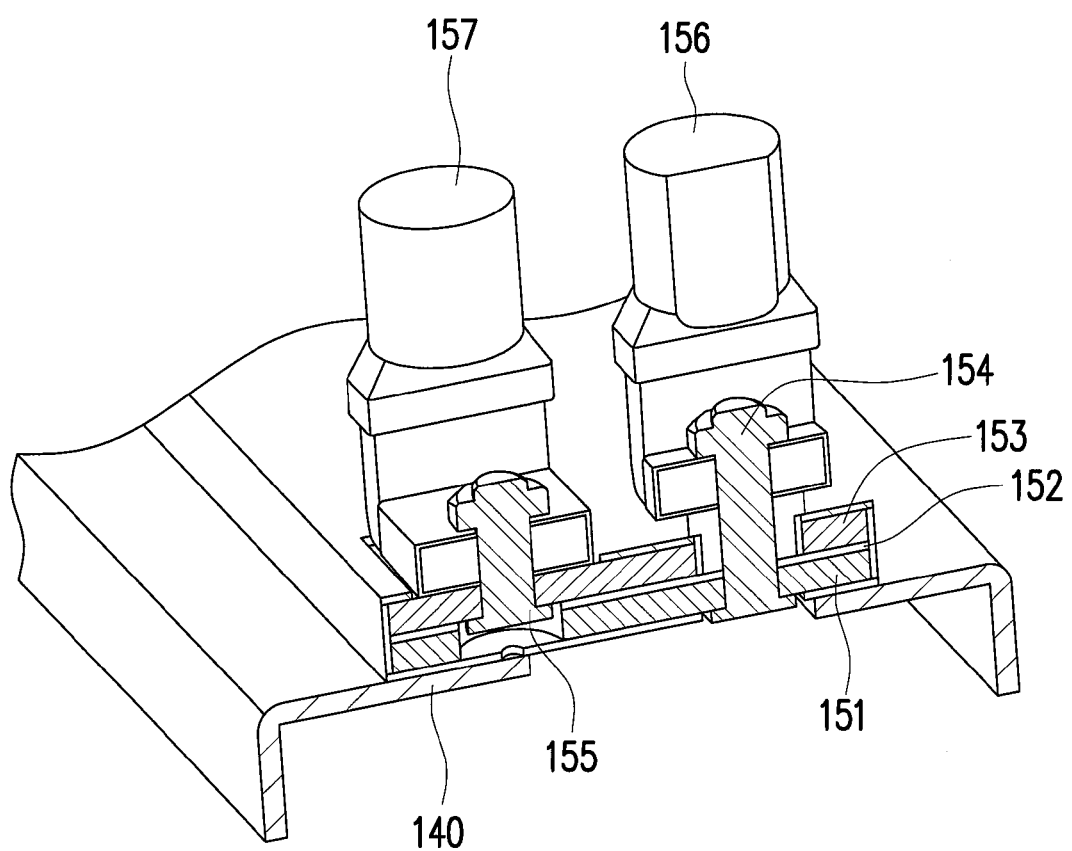
FIG. 8 is a sectional view along B-B' of FIG. 3.

FIG. 8 is a sectional view along B-B' of FIG. 3. Referring to FIG. 7 and FIG. 8, in the embodiment, the power supplying module 150 includes a first conductive plate 151, an insulation layer 152 and a second conductive plate 153, which are superimposed on the base 140 in sequence. The first conductive plate 151, the insulation layer 152 and the second conductive plate 153 are superimposed on the base 140 in sequence, and the insulation layer 152 is configured between the first conductive plate 151 and the second conductive plate 153. Further, the power supplying module 150 further includes a first power supply terminal 154 inserted into the first conductive plate 151 and a second power supply terminal 155 inserted into the second conductive plate 153. The first power supply terminal 154 and the second power supply terminal 155 are connected to the power supply unit 120 in the rack 110 through a first cable 156 and a second cable 157 respectively, so as to obtain the power supplied.

In other words, one end of the first cable 156 and one end of the second cable 157 are electrically connected to the power supply unit 120, the other end of the first cable 156 is attached to the first power supply terminal 154 on the first conductive plate 151, and the other end of the second cable 157 is attached to the second power supply terminal 155 on the second conductive plate 153.

Further, the power supplying module 150 further includes a plurality of output pin pairs 158. A protruding direction of the output pin pair 158 is directed to the rack layer type space C1. On the other hand, the output pin pairs 158 each include a first output pin 158a inserted into the first conductive plate 151 and a second output pin 158b inserted into the second conductive plate 153. Each of the output pin pairs 158 is used for being connected to the server unit 130 in the rack 110, so as to transfer the power to the server unit 130. As shown in FIG. 7, the network board card 170 has a plurality of open holes 170a. Positions of the open holes 170a correspond to the first output pins 158a and the second output pins 158b of the output pin pairs 158. The first output pins 158a and the second output pins 158b of the output pin pairs 158 protrude, through the open holes 170a, in the direction in which the server unit 130 is inserted into the rack 110 (shown in FIG. 1).

Specifically, in the embodiment, the first output pin 158a of each output pin pair 158 passes through the insulation layer 152 and the second conductive plate 153, so as to protrude to the outside of the second conductive plate 153 in the same direction as the second output pin 158b. Further, in order to avoid the electrical connection between the first conductive plate 151 and the second conductive plate 153, a surface of the first conductive plate 151 and a surface of the second conductive plate 153 are both covered with an insulation material, and a ring-shaped insulator 153*a* surrounding the first output pin 158*a* is disposed in the second conductive plate 153, so as to prevent the first output pin 158*a* from electrically contacting the second conductive plate 153.

Further, referring to FIG. 2 and FIG. 3, in the embodiment, the number of the power supplying modules 150 is two, and the two power supplying modules 150 are superimposed on the upper half part and the lower half part of the base 140 respectively. The two power supplying modules 150 are disposed independent of each other, and are both superimposed along the vertical axis V1 and on the same surface of the base 140. The first power supply terminal 154 and the second power supply terminal 155 of the power supplying module 150 on the upper half part of the base 140 are disposed at the same ends of the first conductive plate 151 and the second conductive plate 153 respectively.

Referring to FIG. 3, FIG. 5 and FIG. 7, in the embodiment, the server unit 130 has a set of positioning holes 130*c*, a set of electrodes 130*d* and a network interface 130*b* at an end inserted into the rack 110. A plurality of sets of positioning pins 142 is configured along the vertical axis direction V1 on the base 140, and is disposed on two opposite sides of the first output pin 158*a* and the second output pin 158*b* of an output pin pair 158 respectively. Top ends of the positioning pins 142 are higher than top ends of the output pin pair 158. The positioning pins 142 protrude to the outside through the open holes 170*a* of the network board card 170.

In the embodiment, a position in the rack 110 where a set of positioning pins 142 and a corresponding output pin pair 158 thereof are disposed matches a rack layer type space C1 (indicated in FIG. 2) of the rack 110. A position of a set of positioning pins 142 correspondingly matches at least one network interface 172 of the network board card 170 and an output pin pair 158 of the power supplying module 150. An output pin pair 158 of the power supplying module 150 corresponds to a position where a network interface 172 of the network board card 170 is disposed in a one-on-one manner. When a set of positioning pins 142, as shown in FIG. 5, is correspondingly connected by insertion to a set of positioning holes 130*c* on the server unit 130, the first output pin 158*a* and the second output pin 158*b* of the output pin pair 158 corresponding to the set of positioning pins 142 are electrically connected to a pair of electrodes 130*d* of the server unit 130 respectively. The network interface 172 corresponding to the set of positioning pins 142 is connected by insertion to the network interface 130*b* of the server unit 130.

In other words, the positioning pins 142, the first output pin 158*a* and the second output pin 158*b* of the output pin pair 158, and the network interface 172 protrude along the horizontal axis H1 in the same direction, and the protruding direction thereof is opposite to the direction in which the server unit 130 is inserted into the rack 110, so that when the positioning pins 142 on the base 140 are correspondingly connected by insertion to the positioning holes 130*c* on the server unit 130, the output pin pair 158 corresponding to the positioning pins 142 is electrically connected to the electrodes 130*d* of the server unit 130 respectively to transfer the power to the server unit 130, and the network interface 172 is connected to the network interface 130*b* of the server unit 130 to transmit data.

Figure 9:
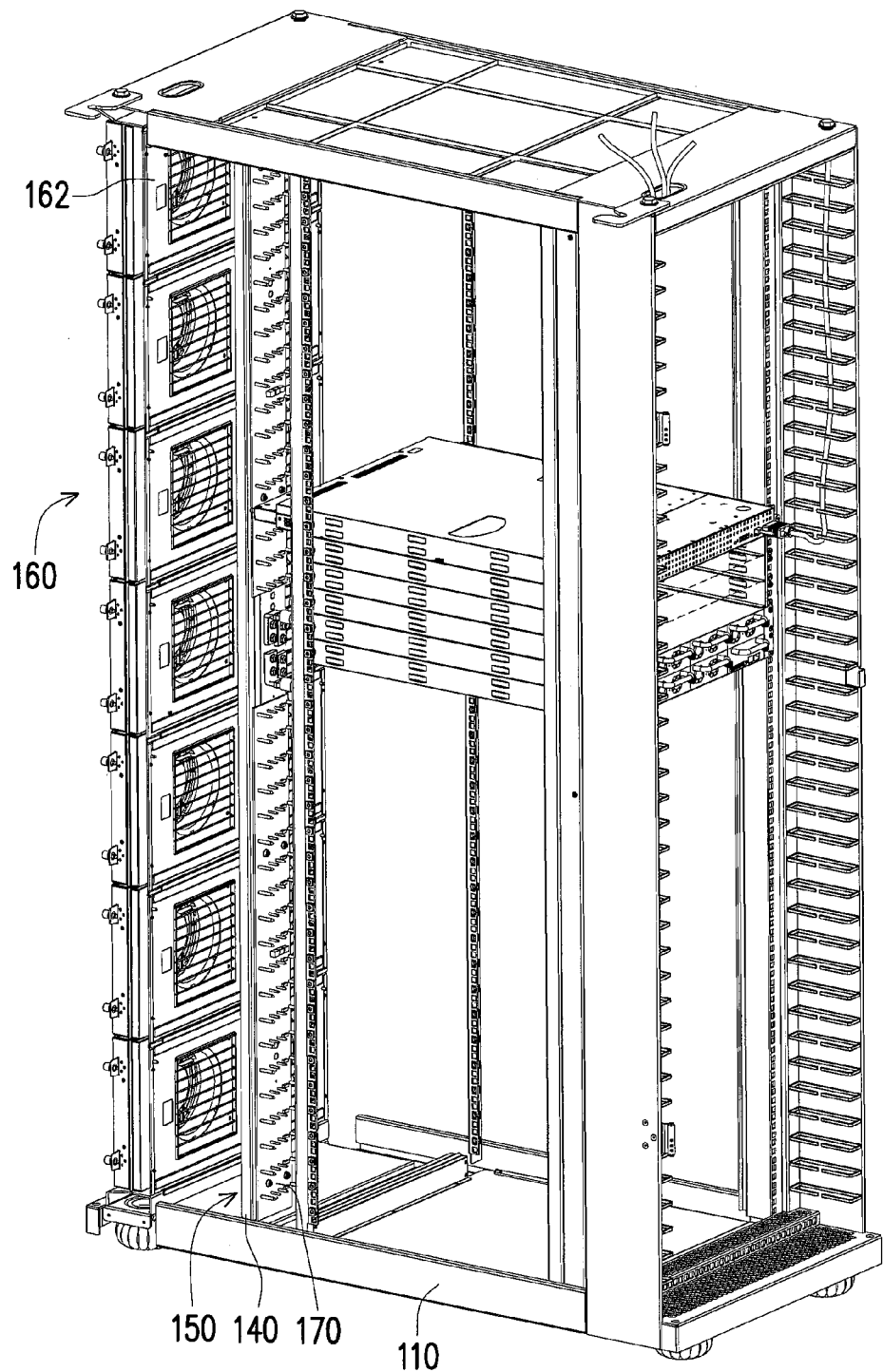
FIG. 9 is a schematic view of partial members of the server rack system of FIG. 1.

FIG. 9 is a schematic view of partial members of the server rack system of FIG. 1. Referring to FIG. 9, in the embodiment, the server rack system 100 further includes a fan wall 160 disposed on a rear wall of the rack 110 and formed by a plurality of fan units 162. The base 140, the network board card 170 and the power supplying module 150 are disposed between the fan wall 160 and the rack layer type spaces C1.

Figure 10:
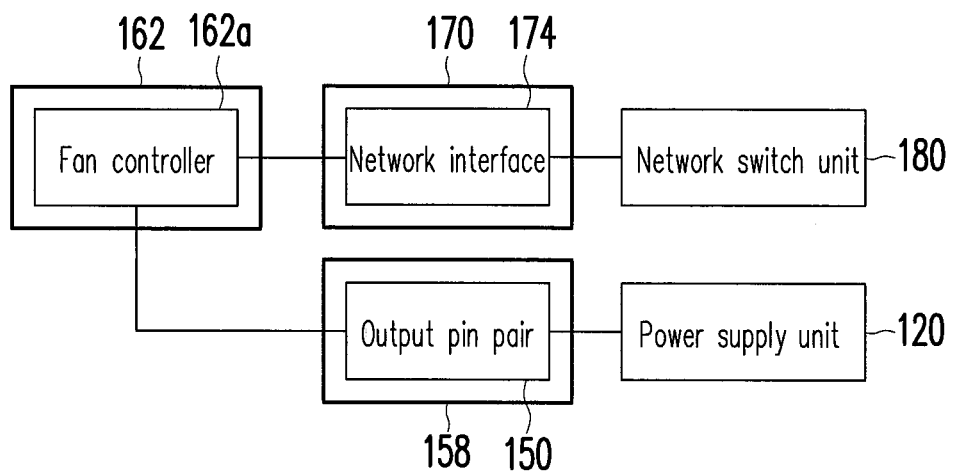
FIG. 10 is a block diagram of the partial members of the server rack system of FIG. 9.

FIG. 10 is a block diagram of partial members of the server rack system of FIG. 9. Referring to FIG. 10, in the embodiment, the fan units 162 each have a fan controller 162*a*. The fan controller 162*a* is connected to the network switch unit 180 by a network interface 174 on the network board card 170, and is connected to the power supply unit 120 by an output pin pair 158 on the power supplying module 150.

Figure 11:
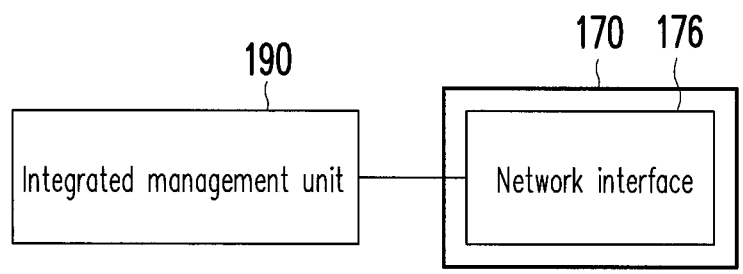
FIG. 11 is a block diagram of partial members of the server rack system of FIG. 1.

FIG. 11 is a block diagram of partial members of the server rack system of FIG. 1. Referring to FIG. 2 and FIG. 11, in the embodiment, the server rack system 100 further includes an integrated management unit 190, which is slidably inserted into a rack layer type space C1 along the horizontal axis direction H1. The integrated management unit 190 is connected to a network interface 176 on the network board card 170, and is used to manage the server unit 130 in the rack 110 through the network switch unit 180.

In view of the above, in the embodiments of the present invention, the network board card is configured in the rack, and the network board card includes the plurality of network interfaces, so that after being assembled in the rack, the server unit and the network switch unit can be connected to the corresponding network interfaces automatically, and therefore the server unit and the network switch unit perform data transmission through the network board card. In this way, the situations that the poor space utilization rate may be caused by electrical connection performed by using cables and operation of a user is hindered by messed cable configuration can be avoided effectively, and a neat transmission structure acts as a replacement, thereby achieving an effect of electrical connection required by the server unit and the network switch unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server rack system, comprising:
    a rack, wherein the rack comprises a plurality of rack layer type spaces arranged along a vertical axis direction, and the rack layer type spaces are used for receiving at least one network switch unit and at least one server unit slidably inserted along a horizontal axis direction; and
    at least one network board card, disposed between the top and the bottom of the rack along the vertical axis direction, wherein the network board card comprises a plurality of network interfaces, and the network interfaces are arranged along the vertical axis direction on the network board card,
    wherein the network interfaces at least comprise a first type network interface used for being connected to the network switch unit and a second type network interface used for being connected to the server unit, and the first type network interface is connected to the second type network interface by an integrated circuit deployed in the network board card.

2. The server rack system according to claim 1, wherein the network interfaces protrude in a direction in which the network switch unit and the server unit are inserted into the rack; after the network switch unit and the server unit are inserted into the rack, the first type network interface is connected by insertion to a network interface of the network switch unit, and the second type network interface is connected by insertion to a network interface of the server unit.

3. The server rack system according to claim 1, wherein the first type network interface is disposed in the middle of the network board card.

4. The server rack system according to claim 1, wherein positions in which the network interfaces are disposed correspond to the rack layer type spaces of the rack in a one-on-one manner.

5. The server rack system according to claim 1, further comprising:
a base, disposed along the vertical axis direction and between the top and the bottom of the rack,
wherein the network board card is superimposed on a surface of the base along the vertical axis direction.

6. The server rack system according to claim 5, further comprising:
a power supply unit, slidably inserted in one of the rack layer type spaces along the horizontal axis direction; and
at least one power supplying module, disposed along the vertical axis direction and between the base and the network board card, and for transferring power between the power supply unit and the server unit, wherein the power supplying module comprises:
a first conductive plate, an insulation layer and a second conductive plate superimposed on the base in sequence, wherein the insulation layer is configured between the first conductive plate and the second conductive plate;
a first power supply terminal inserted into the first conductive plate and a second power supply terminal inserted into the second conductive plate, wherein the first power supply terminal and the second power supply terminal are used for connecting the power supply unit in the rack to obtain power supplied; and
a plurality of output pin pairs, wherein each output pin pair comprises a first output pin inserted into the first conductive plate and a second output pin inserted into the second conductive plate, and the plurality of output pin pairs is used for being connected to the server units in the rack, so as to transfer power to the server units,
wherein the network board card comprises a plurality of open holes, positions of the open holes correspond to the first output pins and the second output pins of the output pin pairs, and the first output pins and the second output pins of the output pin pairs protrude through the open holes in a direction in which the server unit is inserted into the rack.

7. The server rack system according to claim 6, wherein the first output pin of an output pin pair passes through the insulation layer and the second conductive plate to protrude to the outside of the second conductive plate in the same direction as the second output pin of the output pin pair.

8. The server rack system according to claim 6, wherein a ring-shaped insulator surrounding the first output pin is disposed in the second conductive plate, and the ring-shaped insulator is used for preventing the first output pin from electrically contacting the second conductive plate.

9. The server rack system according to claim 6, wherein the server unit comprises a set of positioning holes, a set of electrodes and a network interface at an end inserted into the rack.

10. The server rack system according to claim 6, wherein a plurality of positioning pins is configured on the base along the vertical axis direction, a position of a set of positioning pins correspondingly matches at least one network interface of the network board card and an output pin pair of the power supplying module, and an output pin pair of the power supplying module corresponds to a position in which a network interface of the network board card is disposed in a one-on-one manner; and
when a set of positioning pins is correspondingly connected by insertion to a set of positioning holes on the server unit, the first output pin and the second output pin of the output pin pair corresponding to the set of positioning pins are electrically connected to a pair of electrodes of the server unit respectively, and the network interface corresponding to the set of positioning pins is connected by insertion to the network interface of the server unit.

11. The server rack system according to claim 10, wherein the sets of positioning pins, the output pin pairs and the network interfaces protrude along a horizontal axis of the rack in the same direction, and top ends of the sets of positioning pins are higher than top ends of the output pin pairs and top ends of the network interfaces.

12. The server rack system according to claim 10, wherein a position in the rack in which a set of positioning pins and a corresponding output pin pair thereof are disposed matches one of the rack layer type spaces of the rack.

13. The server rack system according to claim 6, wherein the number of the at least one network board card is two, the two network board cards are superimposed on an upper half part and a lower half part of the base respectively, and the two network board cards are disposed independent of each other, and are both superimposed along the vertical axis and on the same surface of the base; and
the number of the at least one power supplying module is two, the two power supplying modules are superimposed on the upper half part and the lower half part of the base respectively, and the two power supplying modules are disposed independent of each other, and are both superimposed along the vertical axis and on the same surface of the base.

14. The server rack system according to claim 6, further comprising:
a fan wall, disposed on a rear wall of the rack and formed by a plurality of fan units, wherein the base, the network board card and the power supplying module are disposed between the fan wall and the rack layer type spaces.

15. The server rack system according to claim 14, wherein the fan units each comprise a fan controller, and the fan controller is connected to the network switch unit by a network interface on the network board card, and is connected to the power supply unit by an output pin pair on the power supplying module.

16. The server rack system according to claim 1, further comprising:
an integrated management unit, slidably inserted in one of the rack layer type space along the horizontal axis direction,
wherein the integrated management unit is connected to a network interface on the network board card, and is used to manage the server unit in the rack through the network switch unit.

* * * * *